United States Patent
Hsu et al.

(10) Patent No.: US 9,299,667 B2
(45) Date of Patent: Mar. 29, 2016

(54) METHOD OF SHAPING DENSELY ARRANGED PL GATES AND PERIPHERAL MOS GATES FOR ILD OXIDE FILL-IN

(71) Applicant: Macronix International Co., Ltd., Hsinchu (TW)

(72) Inventors: Fang-Hao Hsu, Hsinchu (TW); Shih-Ping Hong, Taichung (TW); Hong-Ji Lee, Taoyuan County (TW)

(73) Assignee: MACRONICS INTERNATIONAL COMPANY, LTD., Hsinchu (TW)

( * ) Notice: Subject to any disclaimer, the term of this patent is extended or adjusted under 35 U.S.C. 154(b) by 2 days.

(21) Appl. No.: 14/259,771

(22) Filed: Apr. 23, 2014

(65) Prior Publication Data

US 2015/0311218 A1    Oct. 29, 2015

(51) Int. Cl.
H01L 27/115 (2006.01)
H01L 21/28 (2006.01)
H01L 23/00 (2006.01)
H01L 29/49 (2006.01)

(52) U.S. Cl.
CPC ........ *H01L 23/564* (2013.01); *H01L 21/28273* (2013.01); *H01L 27/11543* (2013.01); *H01L 29/4933* (2013.01)

(58) Field of Classification Search
CPC ............... H01L 27/11517; H01L 21/28273; H01L 23/564; H01L 29/4933; H01L 27/11521; H01L 27/11526; H01L 27/11568; H01L 21/8221
USPC ........................................... 438/587; 257/316
See application file for complete search history.

(56) References Cited

U.S. PATENT DOCUMENTS

2005/0009272 A1 *  1/2005  Chen et al. ..................... 438/257
2014/0252455 A1 *  9/2014  Chuang et al. ................. 257/329

* cited by examiner

*Primary Examiner* — Caleen Sullivan
(74) *Attorney, Agent, or Firm* — Stout, Uxa & Buyan, LLP; Frank J. Uxa

(57) ABSTRACT

A method is described that facilitates inter-layer dielectric fill-in among transistors in a densely-configured array of an integrated circuit. An etch process that exploits a micro-loading effect to create a T-shaped profile between transistors is disclosed. The micro-loading has a negligible effect on transistors in a peripheral region of the integrated circuit.

11 Claims, 4 Drawing Sheets

METHOD OF SHAPING DENSELY ARRANGED PL GATES AND PERIPHERAL MOS GATES FOR ILD OXIDE FILL-IN

BACKGROUND OF THE INVENTION

1. Field of the Invention

The present invention relates generally to methods of semiconductor manufacture and, more particularly, to enhancing the fill-in of inter-layer dielectric material.

2. Description of Related Art

Multi-layered state-of-the-art microchips require fill-in of an inter-layer dielectric (ILD) to isolate transistors of one layer from transistors of another. As geometries become smaller, e.g. in chips having critical dimensions in a sub-3x nm (i.e., sub 30 nm) range, ILD fill-in may include, undesirably, voids that may result in leaking of electrical current between adjacent transistors. Key steps in the ILD fill-in process involve depositing layered materials on a substrate, e.g., silicon, and etching to form a pattern of transistors, e.g., having polysilicon (PL) gates, and depositing insulating material (e.g., oxide) to create an inter-layer dielectric. When oxide fill-in is incomplete, the required isolation between transistors may not be achieved, thereby affecting microchip operation and, commensurately, impacting microchip manufacture by reducing yields and increasing costs. Densely-arranged PL gates and peripheral metal-oxide-semiconductor (MOS) gates suffer under this paradigm, particularly when processed simultaneously.

A need thus exists in the prior art for a method of forming PL gates that facilitates the fill-in of inter-layer dielectric material. A further need exists for a method of simultaneously etching densely arranged and peripheral semiconductor gates.

SUMMARY OF THE INVENTION

The present invention addresses these needs with a method of semiconductor manufacture that provides a semiconductor stack comprising a densely arranged array of gate structures as well as peripheral structures. The semiconductor stack can be provided by forming first and second polysilicon (PL1 and PL2) layers above a substrate, separated from the substrate and from each other by insulating layers, and depositing a metal silicide layer above the PL1 and PL2 layers. A third polysilicon (PL3) layer may be formed to overlie the metal silicide layer, the PL3 layer being separated from the metal silicide layer by an oxide layer. The semiconductor stack may be patterned and etched to remove portions of the PL3 layer and the oxide layer, thereby defining the densely arranged array of gate structures and peripheral structures.

A sequence of etch operations that forms a T-shaped opening between polysilicon gates in the densely arranged gate structure scan enhance an ability to fill-in with inter-layer dielectric material such as tetraethyl orthosilicate (TEOS oxide).The sequence creates a smooth-sided metal-oxide-semiconductor (MOS) gate in the peripheral structures The providing of a semiconductor stack can comprise forming a first insulating layer on the substrate, depositing the PL1 layer on the first insulating layer, overlaying the PL1 layer with a second insulating layer, and depositing the PL2 layer on the second insulating layer.

Subsequently, a first etch may be performed that removes metal silicide, a second etch may remove a first portion of the PL2 layer, and a third etch may remove a second portion of the PL2 layer, a portion of the first insulating layer, and a portion of the PL1 layer. According to an implementation of the method, the performing of the second etch may introduce a micro-loading effect that stops above the second insulating layer of the densely arranged array of gate structures. The performing of the second etch can comprise etching with $HBr/O_2/N_2$ and/or may create a V-shaped or U-shaped profile in the PL2 layer of the densely arranged array of gate structures while forming a substantially vertical profile in the PL2 layer of the peripheral structures.

While the method has or will be described for the sake of grammatical fluidity with functional explanations, it is to be expressly understood that the claims, unless indicated otherwise, are not to be construed as limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing the present invention, certain aspects, advantages and novel features of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

DETAILED DESCRIPTION OF THE INVENTION

Figure 1:
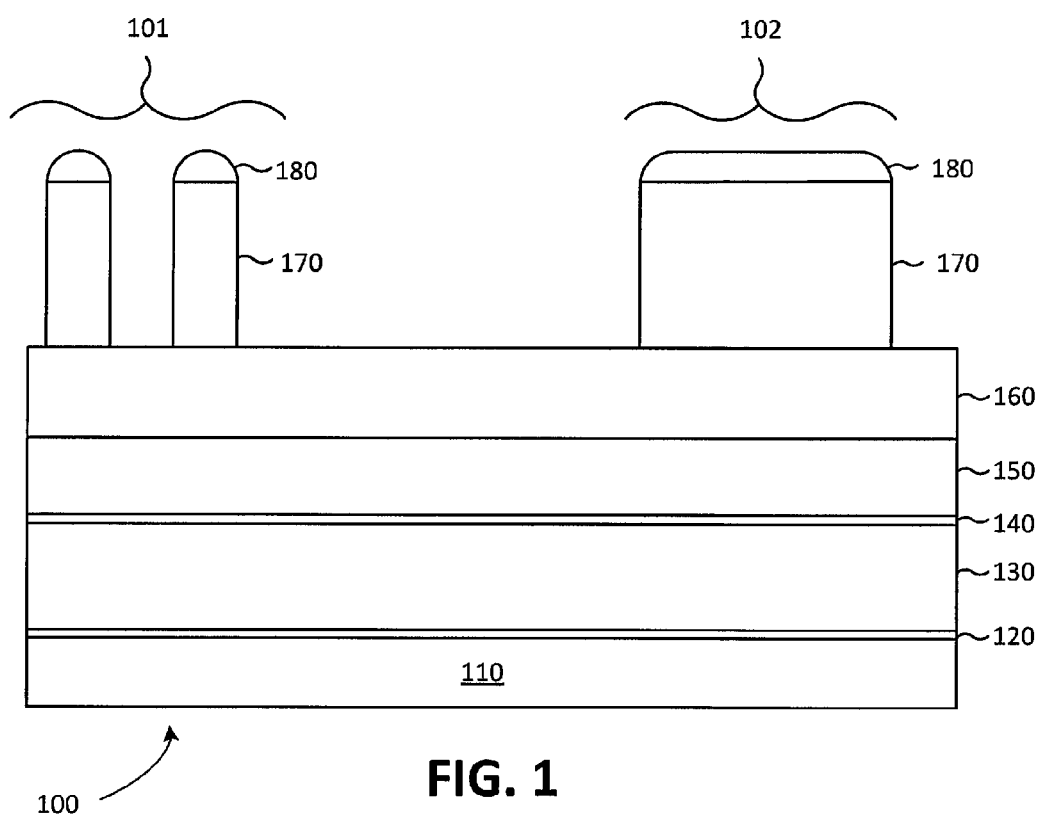
FIG. 1 is a cross-sectional view of a semiconductor stack after processing that defines, at a partially-formed stage, a densely-arranged region and a peripheral region.

Examples of the invention are now described and illustrated in the accompanying drawings, instances of which are to be interpreted to be to scale in some implementations while in other implementations, for each instance, not. In certain aspects, use of like or the same reference designators in the drawings and description refers to the same, similar or analogous components and/or elements, while according to other implementations the same use should not According to certain implementations, use of directional terms, such as, top, bottom, left, right, up, down, over, above, below, beneath, rear, and front, are to be construed literally, while in other implementations the same use should not. The present invention may be practiced in conjunction with various integrated circuit manufacturing techniques that are conventionally used in the art, and only so much of the commonly practiced process steps are included herein as are necessary to provide an understanding of the present invention. The present invention has applicability in the field of semiconductor manufacturing and processes in general. For illustrative purposes, however, the following description pertains to densely-arranged and peripheral polysilicon gates and a related methods of manufacture.

Referring more particularly to the drawings, FIG. 1 describes an example of two of a plurality of first stacked structures disposed in a portion of a densely-arranged array 101, which may be referred to as a nest area, of a semiconductor structure 100. Also illustrated is an example of one of a plurality of second stack structures disposed in a peripheral region 102 of the semiconductor structure 100 resulting from an early stage in a process of fabricating an integrated circuit. The semiconductor structure 100 may comprise a substrate 110, which may be formed of silicon or any of several other materials commonly used as substrates in semiconductor manufacture. The substrate 110 may be overlaid with a first dielectric (e.g., thin oxide [TOX]) layer 120 that may be formed of $SiO_2$ by a known furnace process at about 1000° C. to a thickness ranging from about 40 Å to about 100 Å in typical embodiments. A first polysilicon (PL1) layer 130 may be deposited on the TOX layer 120 using, for example, a chemical vapor deposition (CVD) and/or a plasma enhanced CVD (PECVD) process to a thickness for instance of about 1000 Å or that may range from a minimum value of about 800 Å to a maximum value of about 1500 Å. A second dielectric layer comprising, in a typical embodiment, a layer formed of, for example, silicon dioxide or an oxide-nitride-oxide (ONO) layer 140, having an exemplary/typical thickness ranging from about 40 Å to about 60 Å may be formed on the PL1 layer 130 using methods known in the art, and a second polysilicon (PL2) layer 150 may be deposited on the ONO layer 140 by employing a CVD or PECVD process. A thickness of the PL2 layer 150 may be, at a minimum, about 800 Å and at a maximum, about 1500 Å with an exemplary or typical thickness being about 1000 Å. A conducting layer 160, formed of a metal silicide, e.g., tungsten silicide (WSi), may overlay the PL2 layer 150 to an exemplary or typical thickness of about 800 Å using a CVD or PECVD process. The thickness of the WSi layer 160 may range between about 600 Å and about 1200 Å. An additional oxide (OX) layer 170, which may be formed of, for example, silicon dioxide, and a third polysilicon (PL3)layer 180 may be sequentially formed (e.g., deposited) to thicknesses, for example, of about 300 Å and 1500 Å on the structure so far described, and then all or a portion of the PL3 and OX layers 170 and 180 may be removed using known photoresist techniques employing a pattern that results in the semiconductor structure 100 illustrated in schematic cross-sectional format in FIG. 1.

Figure 2:
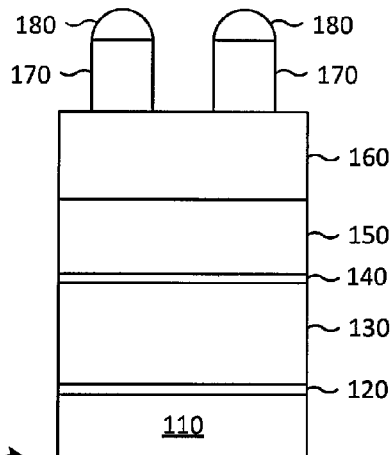
FIG. 2 illustrates the densely-arranged region of the structure of FIG. 1.
Figure 3:
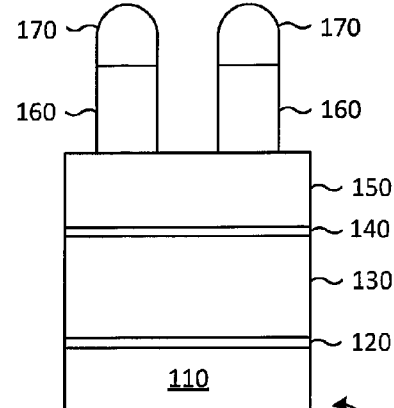
FIG. 3 is a graphical representation of a result of a first etch step that is applied to the densely-arranged region of the structure of FIG. 2 and that removes polysilicon, oxide, and silicide material.

An etch step may be performed on the semiconductor structure 100 of FIG. 1 that continues a process of forming densely-arranged and peripheral transistor structures. The etch step, e.g., a WSi etch, which may use a plasma etch process employing an etchant such as $CHF_3$, $SF_6$, $NF_3$, $CF_4$, $Cl_2$, HBr and the like, for example, may remove a portion of the WSi layer 160 according to a masking effect imposed by the PL3 layer 180 and the OX layer 170 that may control the configuration of the densely-arranged 101 and peripheral 102 portions of the structure of FIG. 1. FIG. 2 illustrates the densely-arranged portion of the structure before application of the WSi etch; FIG. 3 illustrates a result of the WSi etch whereby the PL3 layer 180 and an upper portion of the OX layer 170 are removed.

Figure 6:
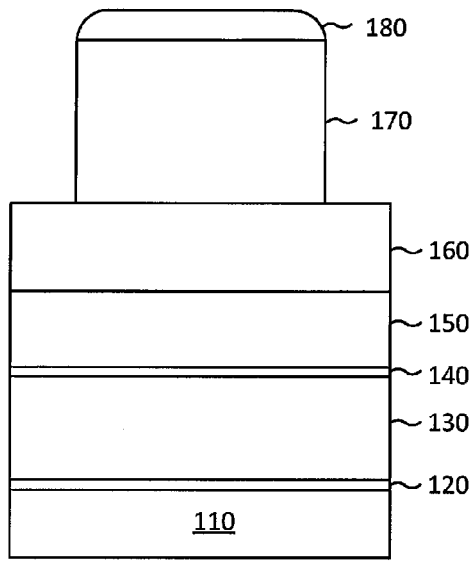
FIG. 6 illustrates the peripheral portion of the semiconductor stack referenced above in FIG. 1.
Figure 7:
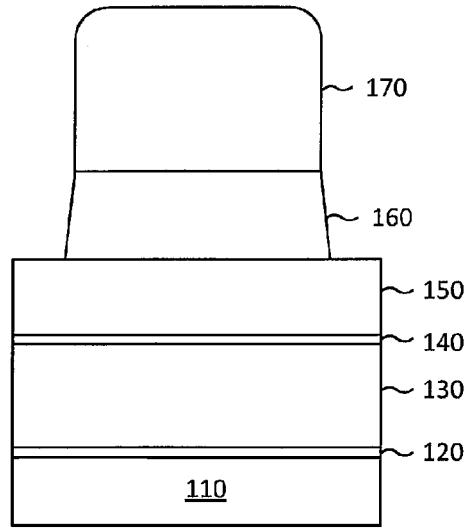
FIG. 7 shows a result in the peripheral portion of the semiconductor stack following the first etch step.

An effect of the WSi etch, which may completely or partially remove the PL3 layer 180 and a portion of the OX layer 170, is illustrated for the peripheral region 102 in FIG. 6 before the etch step and in FIG. 7 after the WSi etch. The transition from FIG. 6 to FIG. 7 shows the effect of removing portions of the WSi layer 160 not masked by the PL3 layer 180 and the OX layer 170.

Figure 4:
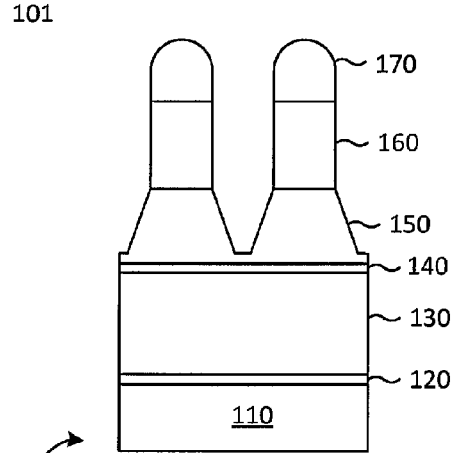
FIG. 4 describes graphically an effect of a second etch step that removes a portion of a layer of polysilicon material from the structure of FIG. 3.

A second etch step, which may be embodied as or referred to as a PL2 etch, may employ a highly sensitive recipe of, for example, $HBr/O_2/N_2$, to remove a portion of the PL2 layer 150. FIG. 4 illustrates an effect of the PL2 etch which, as a consequence of the sensitive nature of the PL2 etchant, may enable controlling the etch rate in order to terminate the etch step' before the ONO layer 140 is reached in both the densely-arranged and peripheral regions. A micro-loading effect, i.e., a decrease of the etch rate in a region of relatively high pattern density, may manifest itself in the densely-arranged region, thereby resulting in formation of a V-shaped profile in the PL2 layer 150 of the densely arranged region 101 as illustrated in FIG. 4. In other embodiments the PL2 layer 150 profile may take a more rounded or U-shaped profile (not illustrated).

Figure 8:
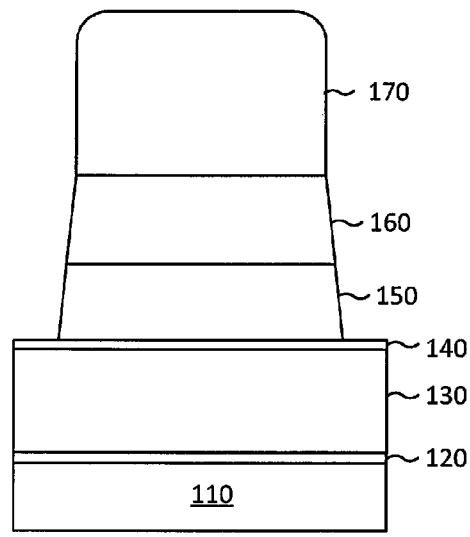
FIG. 8 shows an effect of applying the second etch step to the peripheral portion of the structure of FIG. 7.

The PL2 etch, further, may remove about or substantially the entire unmasked PL2 layer 150 in the peripheral region 102, as illustrated in FIG. 8, the transistor elements in the peripheral region 102 being relatively widely spaced compared to the relatively narrow spacing of elements in the densely-arrayed region 101. That is, effects of micro-loading, which may influence an extent to which the PL2 layer 150 is removed in the densely-arranged region 101, may be about negligible or essentially negligible in the peripheral region 102.

Figure 5:
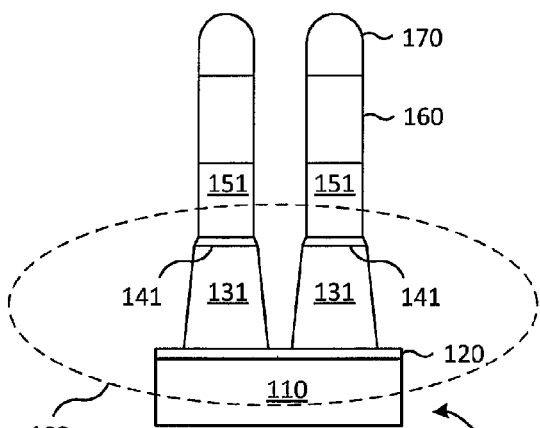
FIG. 5 is an illustration of a result of a third etch step that creates a T-shaped profile in the structure of FIG. 4.
Figure 9:
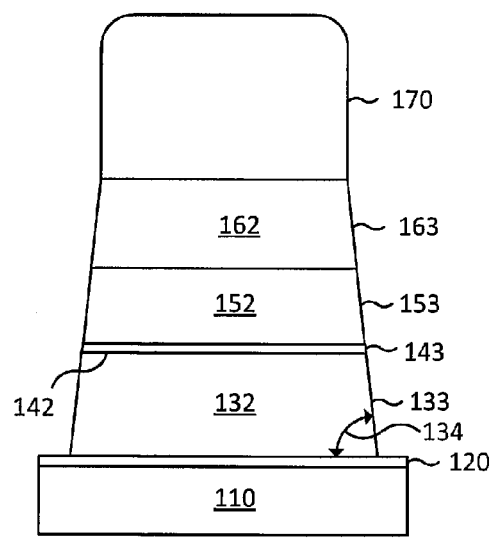
FIG. 9 describes an effect of the third etch step applied to the structure of FIG. 8.

A third etch step, which may be embodied as or referred to as an ONO/PL1 etch, may then be used to remove unmasked portions of the ONO layer 140 and the PL1 layer 130 resulting in the FIG. 5 densely-arranged region 101 and the FIG. 9 peripheral region 102. This removal may form floating gates (FGs) 131 and ONO spacers 141 in, respectively, the PL1 layer 130 and the ONO layer 140 (i.e., the second dielectric layer) of the densely arranged region 101. The same etch step may form FGs 132 and ONO spacers 142 in, respectively, the PL1 layer 130 and the ONO layer 140 of the peripheral region 102. The ONO/PL1 etch may employ etchants such as, for example, $CF_4$, $CHF_3Cl_2$, $CH_2F_2$, HBr, $O_2$, and/or $N_2$ and the like.

The selectivity of both dense and peripheral regions may range from about 0.3 to about 0.9; the PL1 etch may include an over-etch ranging from about 30% to 150%.

Figure 5A:
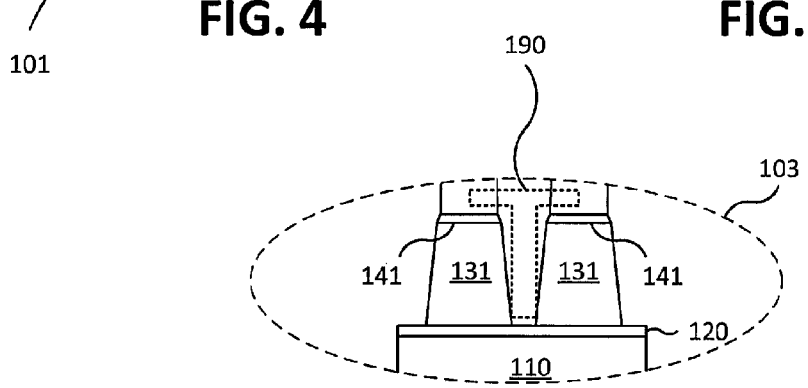
FIG. 5A illustrates a T-shaped dashed outline of an opening between transistors.

The same etch step may complete formation of control gates (CGs) 151 in the PL2 layer 150 of the densely-arranged region 101. The ONO/PL1 etch may also result in relatively wide spacing between CGs and relatively narrow spacing between FGs, which spacing may create an opening between transistors (emphasized by a dashed outline 190 in FIG. 5A). A cross-section of the opening may resemble and be referred to as a T-shaped profile. The spacing, being wider at an upper part of the T-shaped dashed outline 190 than at a low part thereof, may facilitate fill-in of insulating/dielectric material. That is, the T-shaped profile may allow fill-in with inter-layer dielectric (ILD) material of the opening with substantially no voids, thereby providing effective inter-layer isolation (in the densely-arranged region 101.

At the same time, the ONO/PL1 etch may remove substantially all unmasked portions of the ONO layer 140 and the PL1 layer 130 in the peripheral structure 102 of FIG. 8. The removal results in essentially smooth and/or substantially vertical sides 133, 143, 153, 163 on the upper layers 130, 140, 150, 160, 170 of structures formed in the peripheral region 102 as illustrated in FIG. 8 (before) and FIG. 9 (after) and, furthermore, may create FGs 132, ONO spacers 142 and CGs 152 for MOS transistors.

Figure 10:
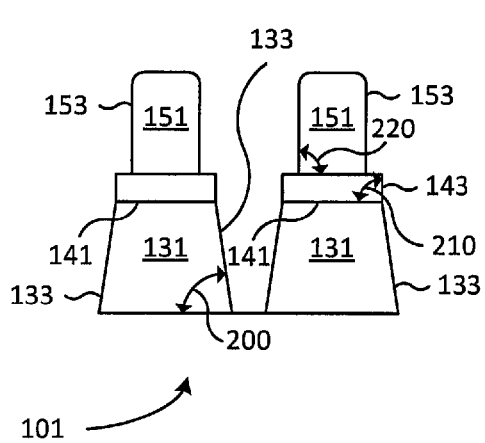
FIG. 10 illustrates angles of surfaces of a portion of the structure of FIG. 5 resulting from an implementation of a method of the present invention.
Figure 11:
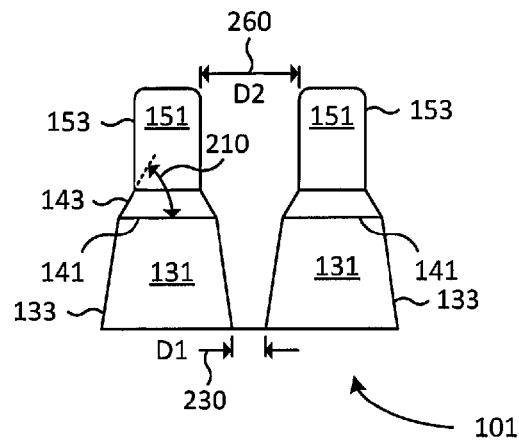
FIG. 11 describes alternative surface angles of the portion of the structure of FIG. 5 resulting from application of another implementation of a method of the present invention.

The method just outlined may produce, for structures in the densely-arranged region 101 as shown in FIGS. 10 and 11, edges 133 of the FGs 131 (i.e., first polysilicon layers), edges 153 of the CGs 151 (i.e., second polysilicon layers), and edges 143 of the ONO spacers 141 (i.e., second dielectric layers) having profiles with shapes that can be described, in part, by angles measured relative to a substantially flat surface of the substrate (not shown). In particular, a PL1 angle 200, corresponding to a slope (e.g., a first slope) of an edge 133 of a FG 131 may take on values ranging from about 75° to about 90°, and a PL2 angle 220, corresponding to a slope (e.g., a second slope greater than the first slope) of an edge 153 of a CG 151, may range from about 75° to about 105°. These ranges of angle values may improve ILD fill-in and reduce instances of inadvertent connecting (i.e., bridging) between FGs and CGs and/or between adjacent FGs and/or adjacent CGs. Edges 143 of the ONO spacers 141 (i.e., second dielectric layers) may exhibit a profile shape substantially that of a trapezoid (e.g., an isosceles trapezoid) having angles 210 that range from about 38° (tapered corner) as illustrated in FIG. 11 to about 90° (vertical corner) as shown in FIG. 10 with an angle range being for instance about 38° to about 67° in order to achieve optimized fill-in results.

FIG. 11 illustrates examples of relative distances between edges 133 of FGs (i.e., a first distance that separates PL1 layers of adjacent stack structures in the densely-arranged region) and edges 153 of CGs 151 (i.e., a second distance that separates PL2 layers of adjacent stack structures in the densely-arranged region) that may be achieved according to a method of the present invention. A distance D1 230 between FG edges 133 (i.e., between first polysilicon layers of adjacent first stack structures) is relatively small (e.g., it may be about 2 nm, or may be relatively small yet greater than about 2 nm) while another distance D2 260 between CG edges 153 (i.e., between second polysilicon layers of adjacent first stack structures) may be greater than D1 230, e.g., ranging from about 10 nm to about 35 nm. In the illustrated embodiment, e.g., with orientations and dimensions as shown, distance D1 is distance substantially smaller than distance D2 (e.g., distance D1 is about 0.1 to about 0.5 the size of D2, or, alternatively, about 0.5 to about 0.9 the size of D2), the width D1 230 determining the final size of the inter-transistor opening containing the ILD.

Figure 12:
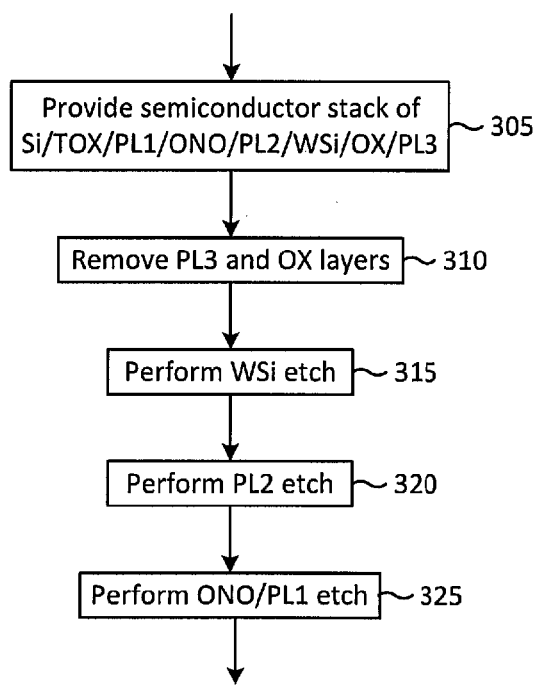
FIG. 12 is a flow chart summarizing an implementation of a method of the present invention.

An implementation of a method of the present invention is summarized in flow chart form in FIG. 12. According to the implementation, and with reference to FIG. 1, a semiconductor structure 100 is provided at step 305, the structure taking a form of a stack comprising layers including a substrate 110, a TOX layer 120, a PL1 layer 130, an ONO layer 140, a PL2 layer 150, a WSi layer 160, an OX layer 170 and a PL3 layer 180. A portion of the PL3 layer 180 and the OX layer may then be removed at step 310 by patterning the stack with photoresist and etching using known methods, the patterning defining a densely-arranged region 101 and a peripheral region 102. Using remaining parts of the PL3 layer 180 and the OX layer 170 as masks, a WSi etch may be performed at step 315 that removes portions of the WSi layer 160 that are not masked by the OX layer 170 as illustrated in FIG. 3 (densely arranged region 101) and FIG. 7 (peripheral region 102). The WSi etch may also remove substantially the entire PL3 layer 180.

At step 320 a PL2 etch may be performed that removes a portion of the PL2 layer 150. The PL2 etch may employ an etchant such as $HBr/O_2/N_2$, the PL2 etch being controlled to stop before or just when the ONO layer 140 is reached. The stopping of the PL2 etch may introduce a V-shaped profile (as illustrated in FIG. 4) in the PL2 layer 150 between elements in the densely-arranged region 101. According to other implementations, a U-shaped profile may be introduced in the PL2 layer 150.

It should be noted that, because transistor elements disposed in the peripheral region 102 are relatively widely spaced, the micro-loading effects that produce the V-shaped or U-shaped profile in the PL2 layer in the densely-arranged region 102 have little to no effect (or a negligible effect) in the peripheral region 102. The PL2 etch at step 320 therefore removes essentially the entire unmasked PL2 layer 150 in the peripheral region 102 as shown in FIG. 8.

A final etch (an ONO/PL1 etch) may be performed at step 325 that removes a remainder of the PL2 layer 150 not masked by the OX layer 170 and that removes a portion of the ONO layer 140 and the PL1 layer 130. The ONO/PL1 etch thereby forms FGs 131 and ONO spacers 141 shown in FIG. 5 in the densely-arranged region 101 having edges 133 (FGs) and 143 (ONO spacers) described in detail in FIGS. 10 and 11. These FG edges 133 and ONO spacer edges 143 may comprise sloping sides that result in a T-shaped profile of space between transistor elements as implied by the dashed outline 190 in FIG. 5A.

In the peripheral region 102, as illustrated in FIG. 9, the effect of the sequence of etch steps 310, 315, 320, and 325 produces, in contrast with the T-shaped profile of FIGS. 5, 5A, 10, and 11, a MOS transistor structure with nearly vertical, smooth sides having FGs 132, ONO spacers 142, and CGs 162 which exhibit respective edges 133, 143, and 163. Edges and sides referred to as vertical, (e.g., nearly vertical or substantially vertical) may exhibit angles, measured relative to a horizontal surface of the substrate 110, that are substantially similar in value to an angle 134 of an edge 133 of a FG 132 shown in FIG. 9, the angle 134 ranging from about 75° to about 120° in typical embodiments. Space between MOS transistors in the peripheral region 102, the MOS transistors being relatively widely separated, exhibits a wide profile (not illustrated) that may not invite a T-shaped characterization.

Although the disclosure herein refers to certain illustrated implementations and embodiments, it is to be understood that these embodiments have been presented by way of example rather than limitation. The intent accompanying this disclosure is to have such embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention as limited only by the appended claims. For example, the invention may apply to other dielectric or conductance etch processes in DRAM as well as in NOR flash and NAND flash (including 3D NAND flash) memories as well as other semiconductor processes as will be clear to one skilled in the art.

What is claimed is:

1. A semiconductor device comprising:
a substrate;
a plurality of first stacked structures arranged on the substrate in a densely arranged region; and
a plurality of second stacked structures arranged on the substrate in a peripheral area, wherein each of the first and second stack structures comprises:
a first dielectric layer overlying the substrate;
a first polysilicon layer overlying the first dielectric layer;
a second dielectric layer overlying the first polysilicon layer;
a second polysilicon layer overlying the second dielectric layer; and
a metal silicide layer overlying the second dielectric layer, wherein the second dielectric layer exhibits a profile shape substantially as a trapezoid.

2. The semiconductor device as set forth in claim 1, wherein the shape of the trapezoid is substantially isosceles.

3. The semiconductor device as set forth in claim 2, wherein sides of the trapezoid form angles ranging from about 38° to about 90°.

4. The semiconductor device as set forth in claim 2, wherein sides of the trapezoid form angles ranging from about 38° to about 67°.

5. The semiconductor device as set forth in claim 1, wherein:
the first polysilicon layer of each first stacked structure exhibits a profile having a first slope; and
the second polysilicon layer of each first stacked structure exhibits a profile having a second slope, wherein the second slope is greater than the first slope.

6. The semiconductor device as set forth in claim 5, wherein the first slope ranges from about 75° to about 90°.

7. The semiconductor device as set forth in claim 5, wherein the second slope ranges from about 75° to about 105°.

8. The semiconductor device as set forth in claim 1, wherein a space between the first polysilicon layers of adjacent first stacked structures exhibits a T-shaped profile.

9. The semiconductor device as set forth in claim 8, wherein:
a first distance separating the first polysilicon layers between adjacent first stack structures is greater than about 2 nm; and
a second distance separating the second polysilicon layers between adjacent first stack structures is greater than the first distance and ranges from about 10 nm to about 35 nm.

10. The semiconductor device as set forth in claim 1, wherein:
the first dielectric layers comprise a thin layer of oxide; and
the second dielectric layers comprise a layer of oxide-nitride-oxide having a thickness ranging from about 40Å to about 100 Å.

11. The semiconductor device as set forth in claim 1, wherein the metal silicide layer comprises tungsten silicide.

* * * * *